US010032672B1

(12) United States Patent
Hung et al.

(10) Patent No.: US 10,032,672 B1
(45) Date of Patent: Jul. 24, 2018

(54) METHOD OF FABRICATING A SEMICONDUCTOR DEVICE HAVING CONTACT STRUCTURES

(71) Applicant: UNITED MICROELECTRONICS CORP., Hsin-Chu (TW)

(72) Inventors: Ching-Wen Hung, Tainan (TW); Shih-Hung Tsai, Tainan (TW); Chorng-Lih Young, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/666,583

(22) Filed: Aug. 2, 2017

(51) Int. Cl.
*H01L 21/82* (2006.01)
*H01L 21/8234* (2006.01)

(52) U.S. Cl.
CPC ........ *H01L 21/823431* (2013.01); *H01L 21/823468* (2013.01); *H01L 21/823475* (2013.01); *H01L 21/823481* (2013.01)

(58) Field of Classification Search
CPC ..... H01L 21/823431; H01L 21/823468; H01L 21/823475; H01L 21/823481
See application file for complete search history.

(56) References Cited

U.S. PATENT DOCUMENTS

| 5,124,276 | A | 6/1992 | Samata |
| 8,765,546 | B1* | 7/2014 | Hung ................ H01L 21/82343 257/190 |
| 2015/0372144 | A1* | 12/2015 | Fang .................. H01L 29/7851 257/192 |
| 2017/0069758 | A1 | 3/2017 | Jan |
| 2017/0098707 | A1 | 4/2017 | Hung |
| 2017/0200656 | A1* | 7/2017 | Li ..................... H01L 21/02164 |
| 2017/0352625 | A1* | 12/2017 | Leobandung ......... H01L 23/535 |

OTHER PUBLICATIONS

Hung, Title of Invention: Semiconductor Device and Manufacturing Method Thereof, U.S. Appl. No. 15/073,633, filed Mar. 17, 2016.

* cited by examiner

*Primary Examiner* — Fernando L Toledo
*Assistant Examiner* — Neil Prasad
(74) *Attorney, Agent, or Firm* — Winston Hsu

(57) ABSTRACT

A method for fabricating a semiconductor device includes the following steps: providing a semiconductor substrate having a first fin; forming a first set of gate structures on the first fin, where the gate structures are surrounded by an interlayer dielectric; forming a first contact hole in the interlayer dielectric between two adjacent gate structures; forming a first dopant source layer on the bottom of the first contact hole, where the dopant source layer comprise dopants with a first conductivity type; and annealing the first dopant source layer to diffuse the dopants out of the first dopant source layer.

16 Claims, 6 Drawing Sheets

METHOD OF FABRICATING A SEMICONDUCTOR DEVICE HAVING CONTACT STRUCTURES

BACKGROUND OF THE INVENTION

1. Field of the Invention

The present invention relates generally to a method of fabricating a semiconductor device, and more particularly, to a semiconductor device including a highly doped region at the bottom of a contact structure electrically couple to a source/drain region of the semiconductor device.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. As the size of the device becomes smaller, the influence of the contact resistance at the interface between the source/drain contact and the source/drain on the electrical properties (such as on-current, $I_{on}$) of the device becomes more significant. Besides, leakage current between the source/drain and the underlying semiconductor substrate is another issue needs to be overcome.

Therefore, the related industries continuously endeavor to improve the related structures and and fabrication processes for reducing the contact resistance between the source/drain contact and the source/drain, and reducing the leakage current between the source/drain and the underlying semiconductor substrate, so as to satisfy device requirements and enhance device performances.

SUMMARY OF THE INVENTION

In order to fulfill the needs for semiconductor devices with lower contact resistance compared with conventional semiconductor devices, a method for fabricating a semiconductor device is disclosed hereafter.

According to one embodiment of the present invention, a method for fabricating a semiconductor device is disclosed and includes the following steps: providing a semiconductor substrate having a first fin; forming a first set of gate structures on the first fin, where the gate structures are surrounded by an interlayer dielectric; forming a first contact hole in the interlayer dielectric between two adjacent gate structures; forming a first dopant source layer on the bottom of the first contact hole, where the dopant source layer comprise dopants with a first conductivity type; and annealing the first dopant source layer to diffuse the dopants out of the first dopant source layer.

According to another embodiment of the present invention, a method for fabricating a semiconductor device is disclosed and includes the following steps: providing a semiconductor substrate having at least two fins respectively in a first region and a second region of the semiconductor substrate; forming gate structures respectively on the fins in the first region and a second region, where the gate structures are surrounded by an interlayer dielectric; forming a first contact hole in the interlayer dielectric between two adjacent gate structures in the first region; forming a second contact hole in the interlayer dielectric between other two adjacent gate structures in the second region; forming a first dopant source layer on the bottom of the first contact hole, where the dopant source layer comprise dopants with a first conductivity type; forming a second dopant source layer conformally disposed on the bottom of the second contact hole after the step of forming a first dopant source layer, where the second dopant source layer comprise dopants with a second conductivity type; and annealing the first dopant source layer and the second dopant source layer to diffuse the dopants respectively out of the first dopant source layer and the second dopant source layer.

According to one embodiment of the present invention, compared with conventional semiconductor devices where planar doped regions are fabricated between the epitaxial structures and the corresponding contact structures, the doped regions formed during the above annealing process are not planar doped regions but U-shaped doped regions. Thus, the contact resistance between the contact structures and the corresponding epitaxial structures may be reduced because the doped regions are disposed not only at the bottom of the contact hole but also at the sidewalls of the contact hole.

According to another embodiment of the present invention, since the doped region is formed by a solid state diffusion process, the doping concentration of which may be very high and uniform compared with conventional doped region fabricated by an ion implantation process. Besides, in a case where the doped region function as a source/drain region, the leakage current between the source/drain region and the underlying substrate may be reduced effectively since there is no highly doped region at the bottom of the contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
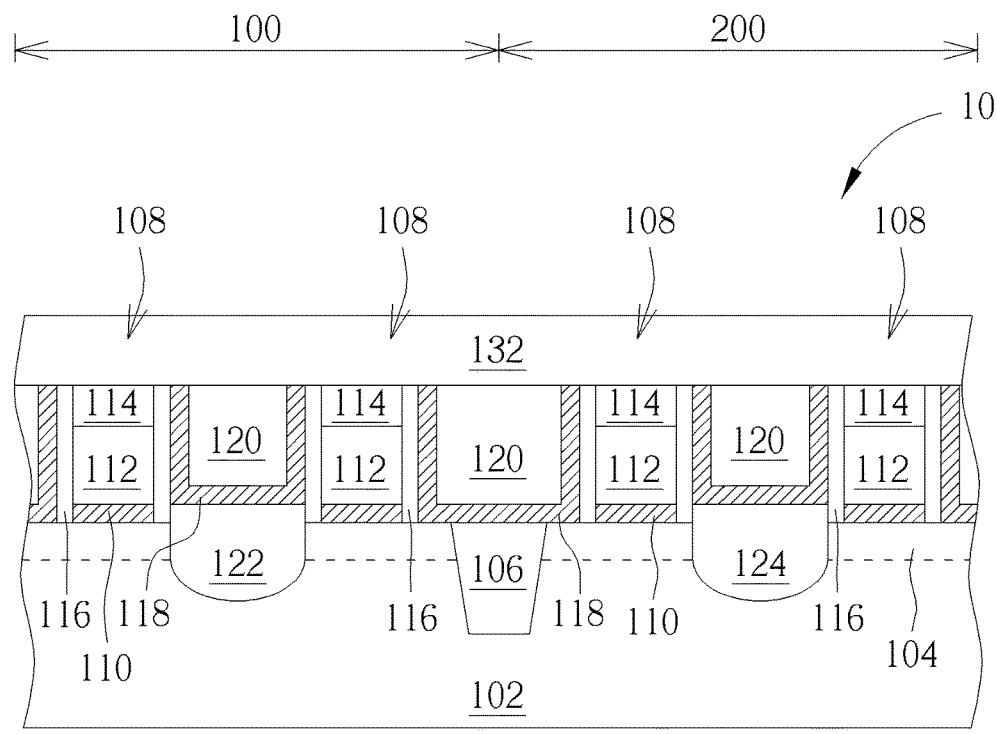
FIG. 1 is a schematic cross-sectional diagram showing a semiconductor device at the beginning of a fabrication process according to one embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

Spatially relative terms, such as "inner," "outer," "beneath," "below," "lower," "above," "upper" and the like, may be used herein for ease of description to describe one element and/or feature's relationship to another element(s) and/or feature(s) as illustrated in the figures. Spatially relative terms may be intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, processes for fabricating a semiconductor device having contact structures are described in detail.

FIGS. 1-5 are cross-sectional diagrams illustrating a method of fabricating a semiconductor device according to a first exemplary embodiment of the present invention. Referring to FIG. 1, a substrate 102 includes a first active region 100 and a second active region 200 is provided. The first active region 100 may be used to accommodate P-channel field-effect transistors, and the second active region 200 may be used to accommodate N-channel field-effect transistor. The substrate 102, for example, may be a silicon (Si) monocrystalline substrate, a silicon-on-insulator (SOI) substrate, and/or a silicon-on-sapphire (SOS) substrate.

At least two fins 104 are respectively disposed in a first active region 100 and the second active region 200 of the substrate 102. The fins 104 may be defined by an isolation structure 106, such as shallow trench isolation (STI). The fins 104 may be made of materials the same as or different from that of the underlying substrate 102, which is dependent on the fabrication requirements.

A first set of gate structures 108 and a second set of gate structures 108 may be respectively formed in the first and second active regions 100 and 200. The gate structures 108 are disposed on the fins 104 in a way that portions of the fin 104 are covered with the gate structures 108. Each of the gate structures 108 may include a gate insulating layer 110, a gate electrode 112, and a capping layer 114 stacked from bottom to top. Spacers 116 made of silicon nitride or silicon carbide may be disposed on the sidewalls of the gate structures 108.

The gate insulating layer 110 may include a silicon oxide film. However, example embodiments are not limited to a silicon oxide film. The gate insulating layer 110 may include a high-k dielectric film having a dielectric constant greater than that of the silicon oxide film. For example, the gate insulating layer may include a silicon nitride ($SiN_x$) film, a tantalum oxide ($TaO_x$) film, a hafnium oxide ($HfO_x$) film, an aluminum oxide ($AlO_x$) film, and/or a zinc oxide ($ZnO_x$) film. Each of the gate electrodes 112 may be, for example, a heavily-doped polysilicon film, a metal film (e.g., a tungsten (W), nickel (Ni), molybdenum (Mo) and/or cobalt (Co) film), a metal silicide film, or any combination thereof. For example, the gate electrodes 112 in the first active region 100 and the second active region 200 may be respectively made of materials with different work functions. For example, each of the gate electrodes 112 may be a multi-layered structure made of a barrier layer and a work function metal layer, but not limited thereto. Preferably, the work function of the work function metal layer in the first active region 100 may be greater than that of the work function metal layer in the second active region 200. The capping layer 114 may be, for example, a silicon nitride film or a silicon oxide film.

Epitaxial structures 122 and 124 may be respectively formed in the first active region 100 and the second active region 200 at two opposite sides of the gate structures 108. According to this embodiment, since the first active region 100 may accommodate the P-channel field effect transistors, the epitaxial structure 122 in the first active region 100 is preferably made of material with larger lattice constant compared with the material surrounding the epitaxial structures 122. In this way, the channel region of the P-channel field effect transistors in the first active region 100 may receive compressive stress from the epitaxial structure 122. On the other hand, since the second active region 200 may accommodate the N-channel field effect transistors, the epitaxial structure 124 in the second active region 200 are preferably made of material with smaller lattice constant compared with the material surrounding the epitaxial structure 124. In this way, the channel region of the N-channel field effect transistors in the second active region 200 may receive tensile stress from the epitaxial structure 124. For example, when the substrate 102 is made of silicon, the epitaxial structure 122 may be mainly made of silicon germanium (SiGe) and the epitaxial structure 124 may be mainly made of silicon phosphorus (SiP). Besides, the epitaxial structures 122 and 124 may be doped epitaxial structures respectively having certain conductivity types. In a case where the epitaxial structures 122 and 124 are doped epitaxial structures, the epitaxial structures 122 and 124 may be regarded as source/drain regions of the field effect transistors.

A contact etch stop layer (CESL) 118 may be conformally disposed on the spacers 116 and the epitaxial structures 122 and 124. An interlayer dielectric (ILD) 120 is disposed on the substrate 102 to surround the gate structures 108. The top surface of the ILD 120 is preferably aligned with the top surface of the gate structures 108, but not limited thereto. As an example, the ILD 120 may be made of a low-k material, such as impurity-doped CVD glass. A cap layer 132, such as an oxide layer, may be disposed on the gate structures 108 and the ILD 120.

Figure 2:
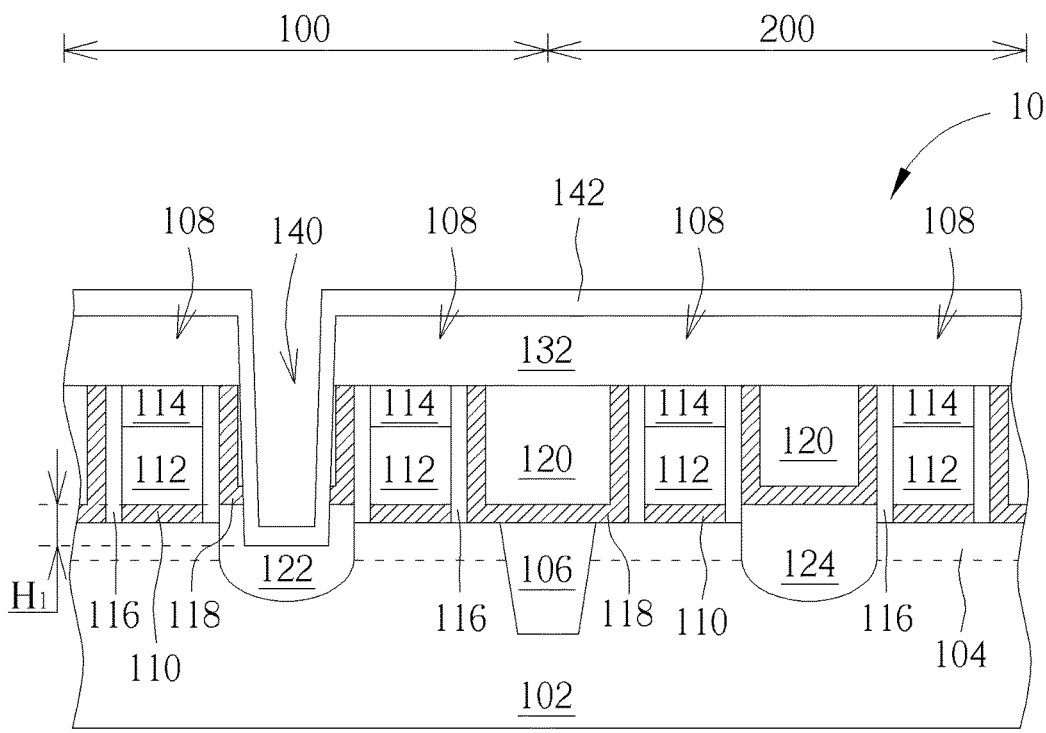
FIG. 2 is a schematic cross-sectional diagram showing a semiconductor device having a contact hole fabricated in a first region according to one embodiment of the present invention.
Figure 3:
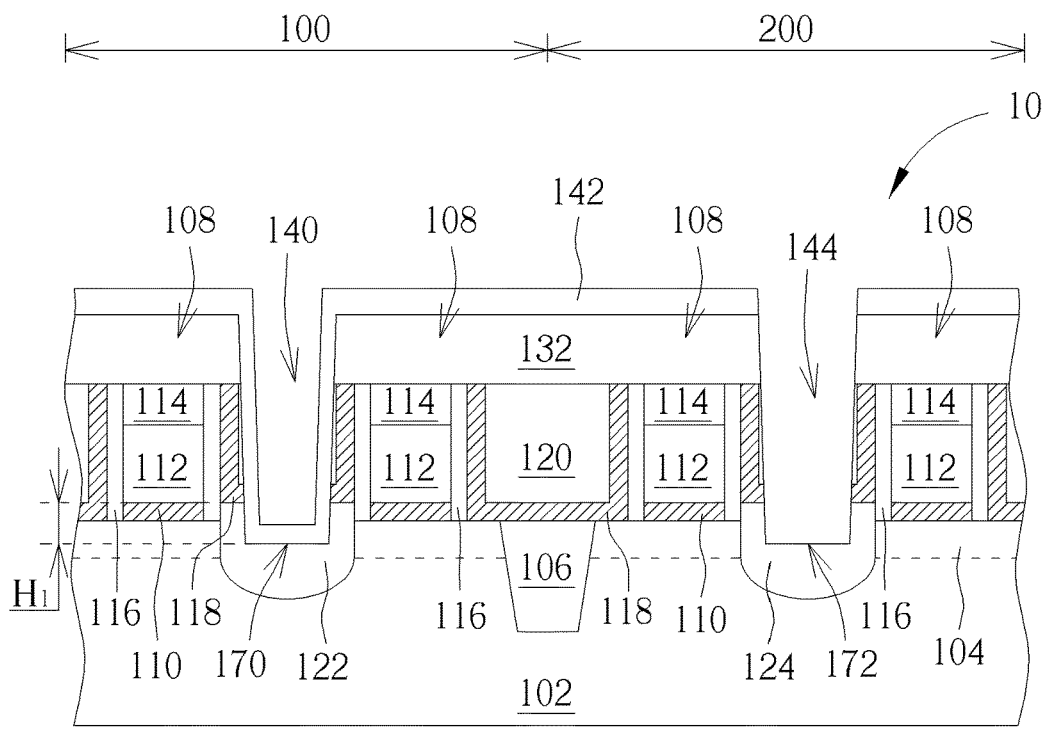
FIG. 3 is a schematic cross-sectional diagram showing a semiconductor device having a contact hole fabricated in a second region according to one embodiment of the present invention.

Then, referring to FIG. 2, a first contact hole 140 is formed in the ILD 120 to expose the epitaxial structure 122 in the first active region 100 from the bottom of the first contact hole 140. The position of the first contact hole 140 may be defined by a patterned mask, such as a photoresist. By controlling an etch depth of the first contact hole 140, portions of the epitaxial structure 122 may be etched so as to form a recess 170 in the epitaxial structure 122. Thus, after the etching process for fabricating the first contact hole 140, a height difference $H_1$ is generated between the upmost surface of the epitaxial structure 122 at the bottom of the first contact hole 140 and the original upmost surface of the unetched epitaxial structure 122. Then, a first dopant source layer 142 is conformally deposited on the sidewalls and the bottom of the first contact hole 140. Preferably, the first dopant source layer 142 may be further conformally deposited on the surface of the cap layer 132. The first dopant source layer 142 is a layer including lots of dopants with certain conductivity type. By applying proper thermal treatment (also called drive in process) in the following process, the dopants in the first dopant source layer 142 may diffuse out of the first dopant source layer 142 and into the regions adjacent to the first dopant source layer 142. For example, the first dopant source layer 142 may be made of borosilicate glass (BSG), and the boron atoms inside the BSG may diffuse out of it and to the adjacent epitaxial structure 122 during thermal treatment conducted in the following process.

Subsequently, a second contact hole 144 is formed in the ILD 120 to expose the epitaxial structure 122 in the second active region 200 from the bottom of the second contact hole 144. Similar to the process for fabricating the first contact hole 140, the position of the second contact hole 144 may also be defined by a patterned mask, such as a photoresist. By controlling an etch depth of the second contact hole 144, portions of the epitaxial structure 124 may be etched so as to form a recess 172 in the epitaxial structure 124. Thus, when the etching process for fabricating the second contact hole 140 is complete, a height difference $H_2$ is generated between the upmost surface of the epitaxial structure 124 at the bottom of the second contact hole 144 and the original upmost surface of the unetched epitaxial structure 124. Portions of the first dopant source layer 142 on the surface of the cap layer 132 in the second active region 200 may be removed during the process of fabricating the second contact hole 114.

Then, a second dopant source layer 146 is conformally deposited on the sidewalls and the bottoms of the first and second contact holes 140 and 144. Since the first dopant source layer 142 in the first contact hole 140 is not removed before and during the process of depositing the second dopant source layer 146, the first dopant source layer 142 in the first contact hole 140 may be fully covered with the second dopant source layer 146. Similar to the composition of the first dopant source layer 142, the second dopant source layer 146 is also a layer including lots of dopants with certain conductivity type. The conductivity type of the dopants in the second dopant source layer 146, however, is opposite the conductivity type of the dopants in the first dopant source layer 142. For example, in a case where the first dopant source layer 142 is made of borosilicate glass (BSG), the second dopant source layer 146 may be made of phosphosilicate glass (PSG) or borophophosilicate glass (BPSG), but not limited thereto.

Figure 4:
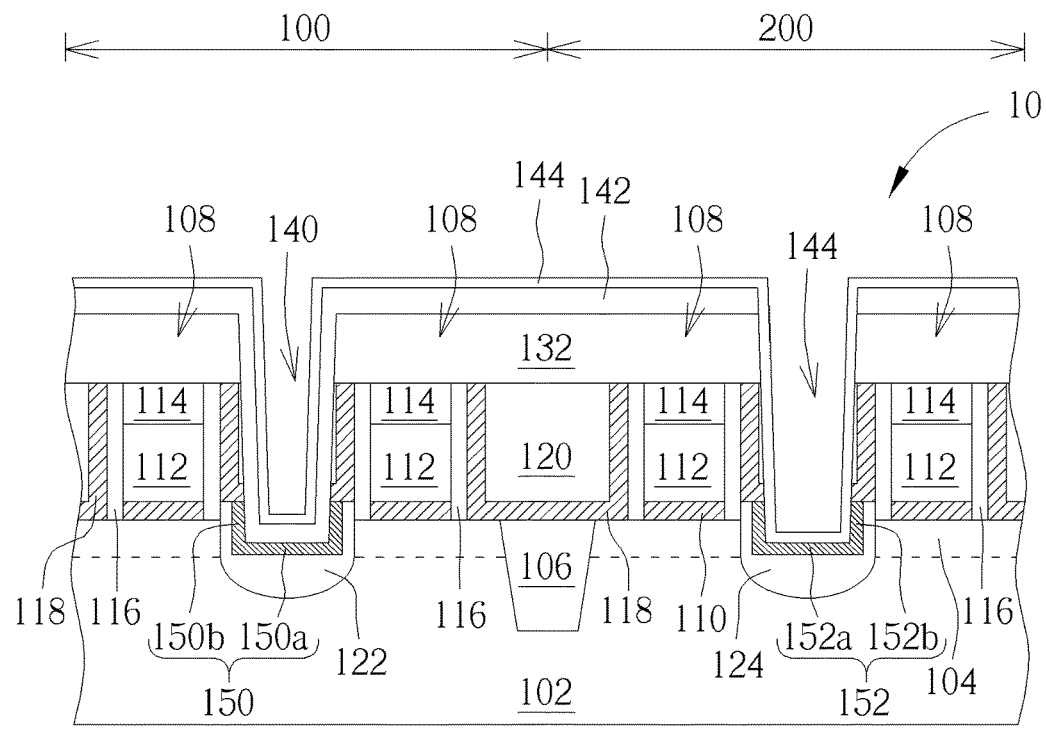
FIG. 4 is a schematic cross-sectional diagram showing a semiconductor device having dopant source layers disposed in contact holes according to one embodiment of the present invention.

After the process of depositing the second dopant source layer 146 is complete, thermal treatment, such as an annealing process, may be conducted to let the dopants in the first dopant source layer 142 and second dopant source layer 146 diffuse into the corresponding epitaxial structures 122 and 124. As shown in FIG. 4, highly doped region 150 and highly doped region 152 may be respectively formed in the first epitaxial structure 122 and second epitaxial structure 124 when the annealing process is complete. For example, the highly doped region 150 in the first epitaxial structure 122 may include a bottom portion 150a and a side portion 150b distributed along the surface of the recess 170. Analogously, the highly doped region 152 in the second epitaxial structure 124 may include a bottom portion 152a and a side portion 152b distributed along the surface of the recess 172. Since the highly doped regions 150 and 152 have doping concentrations higher than the adjacent epitaxial structures 122 and 124, the contact resistance between the epitaxial structures 122 and 124 and the corresponding contact structures fabricated in the following processes may be further reduced. After the step of forming the highly doped regions 150 and 152, a cleaning process may be performed to remove residues remaining on the sidewalls and bottom of the contact holes 140 and 144.

Figure 5:
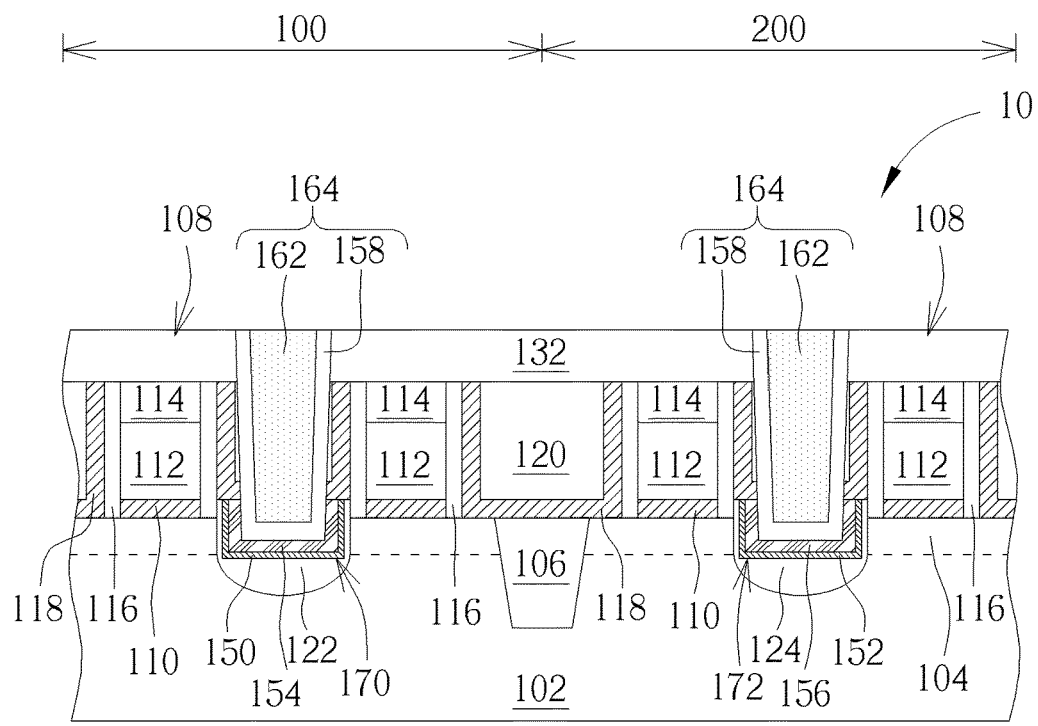
FIG. 5 is a schematic cross-sectional diagram showing a semiconductor device having contact structures according to one embodiment of the present invention.

Subsequently, referring to FIG. 5, silicide layers 154 and 156 may be respectively formed in the first epitaxial structure 122 and the second epitaxial structure 124. Each of the silicide layers 154 and 156 may be U-shaped layer, and the purpose of the silicide layers 154 and 156 is to further reduce the contact resistance of the corresponding transistors. After the formation of the silicide layers 154 and 156, contact structures may be fabricated in the contact holes 140 and 144. For example, each of the contact structures may consist of a barrier metal layer 158 and a main metal layer 162. The barrier metal layers 158 may be formed conformally in the contact holes 140 and 144, the main metal layer 162 may be formed after the step of forming the barrier metal layers 158, and the contact holes 140 and 144 may be respectively filled with the main metal layer 162. A planarization process may be used to make upper parts of the cap layer 132, the barrier metal layers 158, and the main metal layer 162 at the same level, but not limited thereto.

In this embodiment, the barrier metal layers 158 may include nickel (Ni), titanium (Ti), titanium nitride (TiN), tantalum (Ta), tantalum nitride (TaN), titanium aluminum oxide (TiAlO), or other appropriate conductive materials with a single-layered structure or a multi-layered structure. The main metal layer 162 may include conductive materials with relatively lower electrical resistivity, such as aluminum (Al), tungsten (W), or copper (Cu), but not limited thereto.

Compared with conventional semiconductor devices where planar highly doped regions are fabricated between the epitaxial structures and the corresponding contact structures, the highly doped regions 150 and 152 in accordance with the above embodiments are not planar doped regions but U-shaped doped regions. Thus, the contact resistance between the contact structures and the corresponding epitaxial structures 122 and 124 may be further reduced because the highly doped regions 150 and 152 are disposed not only at the bottom of the recesses 170 and 172 but also at the sidewalls of the recesses 170 and 172.

Figure 6:
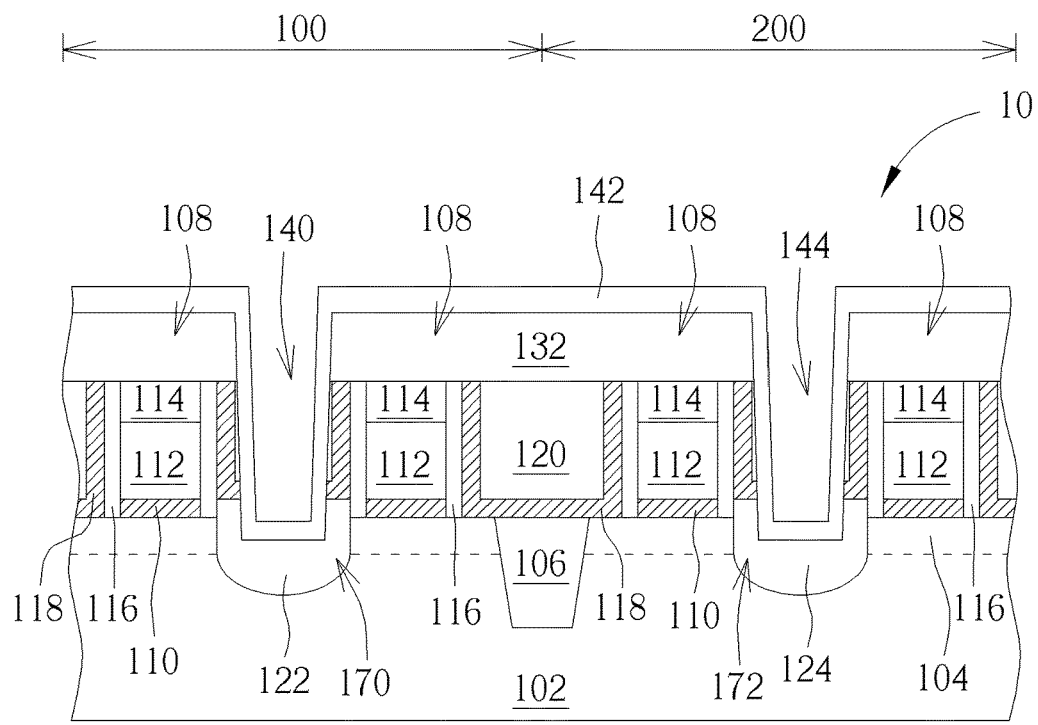
FIG. 6 is a schematic cross-sectional diagram showing a semiconductor device having a dopant source layer disposed in contact holes according to one embodiment of the present invention.
Figure 7:
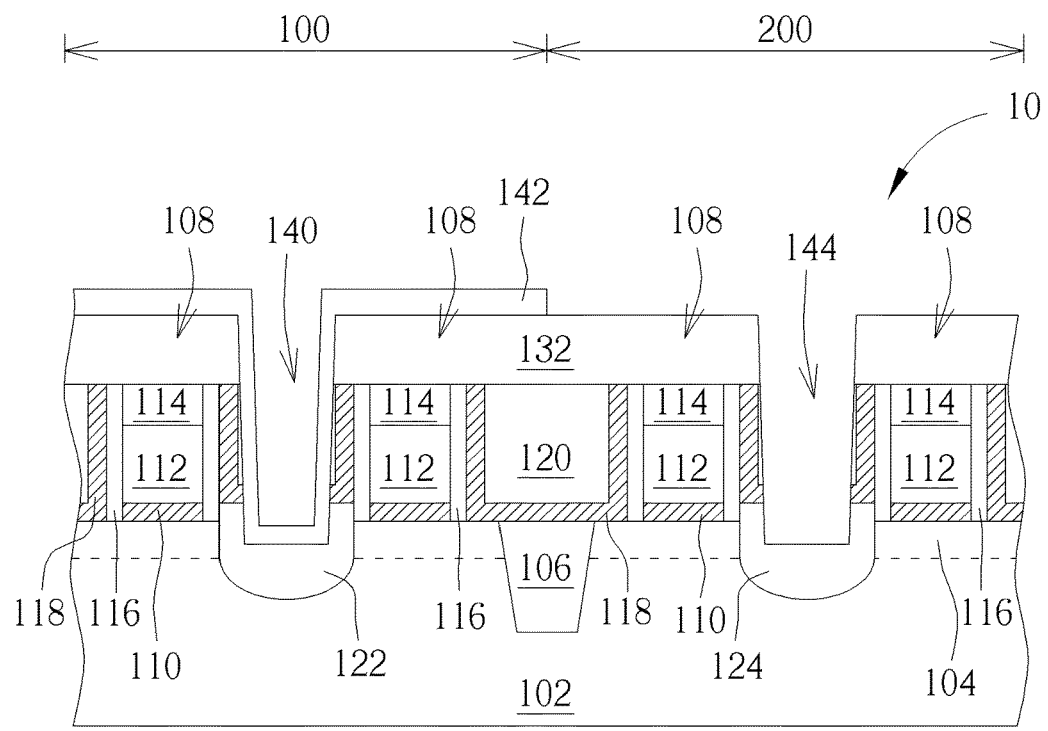
FIG. 7 is a schematic cross-sectional diagram showing a semiconductor device having a patterned dopant source layer disposed in a contact hole according to one embodiment of the present invention.
Figure 8:
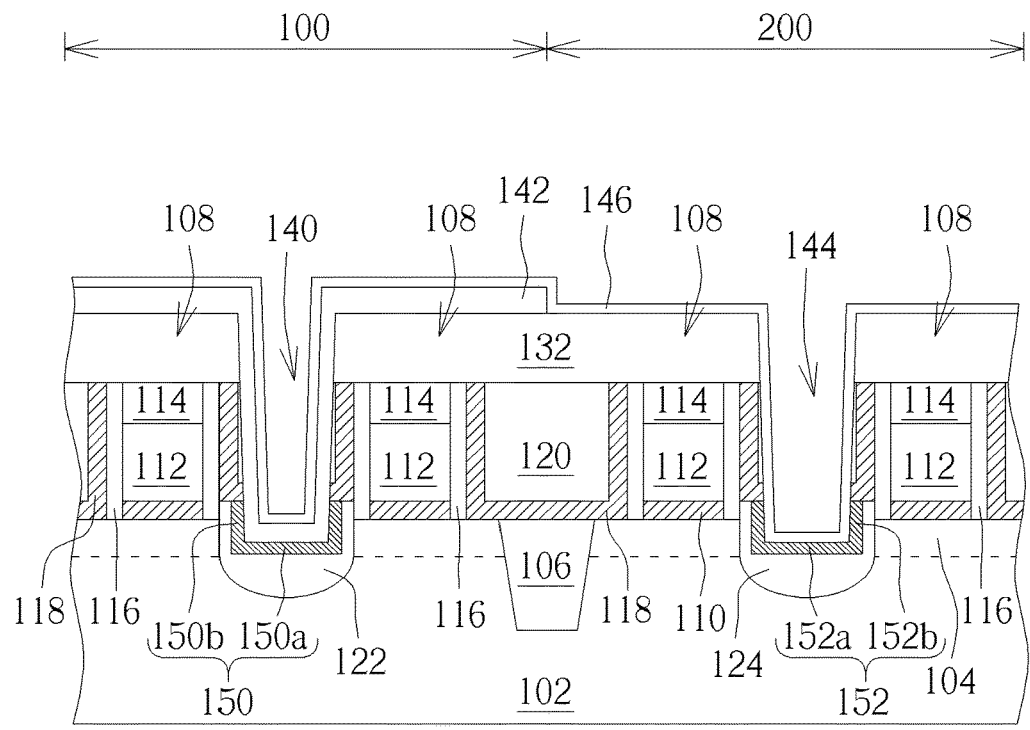
FIG. 8 is a schematic cross-sectional diagram showing a semiconductor device having doped regions at the bottoms of contact holes according to one embodiment of the present invention.

FIGS. 6-8 are schematic cross-sectional diagrams illustrating a method of fabricating a semiconductor device according to a second exemplary embodiment of the present invention. The second exemplary embodiment is fabricated by the processes similar to the processes used in the first exemplary embodiment shown in FIGS. 1-5. The mainly different between the second exemplary embodiment and the first exemplary embodiment is the time to fabricate the first contact hole and the second contact hole.

As shown in FIG. 6, the processing stage shown in FIG. 6 is subsequently to the processing stage shown in FIG. 1. At this stage, the first contact hole 140 and the second contact hole 142 are concurrently fabricated in the ILD 120 rather than sequentially fabricated in the ILD 120. In particular, the first contact hole 140 and the second contact hole are concurrently formed in the ILD 120 to respectively expose the first epitaxial structure 122 and the second epitaxial structure 122 from the bottom of the first contact hole 140 and the second contact hole 144. The position of the contact holes 140 and 144 may be defined by a patterned mask, such as a photoresist. By controlling an etch depth of the first and second contact holes 144, portions of the epitaxial structures 122 and 124 may be etched so as to form recesses 170 and 172 in the epitaxial structures 122 and 124. Thus, after the etching process for fabricating the first and second contact holes 140 and 144, a height difference is generated between the upmost surface of the epitaxial structures 122 and 124 at the bottom of the contact holes 140 and 144 and the original upmost surface of the unetched epitaxial structures 122 and 124.

A first dopant source layer 142 is conformally deposited on the sidewalls and the bottoms of the first contact hole 140 and the second contact hole 144. Preferably, the first dopant source layer 142 may be further conformally deposited on the surface of the cap layer 132. Since the composition of the first dopant source layer 142 in accordance with the second exemplary embodiment is similar to that of the first dopant source layer disclosed in the first exemplary embodiment, the description of which is omitted for the sake of brevity.

Then, referring to FIG. 7, the first dopant source layer 142 is patterned by proper lithographic and etching processes. As a result, the first dopant source layer 142 on the sidewalls and the bottom of the second contact hole 144 may be fully removed.

Subsequently, referring to FIG. 7, a second dopant source layer 146 is conformally deposited on the sidewalls and the bottoms of the first and second contact holes 140 and 144. Since the first dopant source layer 142 in the first contact hole 140 is not removed before and during the process of depositing the second dopant source layer 146, the first dopant source layer 142 in the first contact hole 140 may be fully covered with the second dopant source layer 146. Preferably, the conductivity type of the dopants in the second dopant source layer 146 is opposite the conductivity type of the dopants in the first dopant source layer 142. Since the composition of the second dopant source layer 146 in accordance with the second exemplary embodiment is similar to that of the second dopant source layer disclosed in the first exemplary embodiment, the description of which is omitted for the sake of brevity.

FIGS. 9-12 are schematic cross-sectional diagrams illustrating a method of fabricating a semiconductor device according to a third exemplary embodiment of the present invention.

Figure 9:
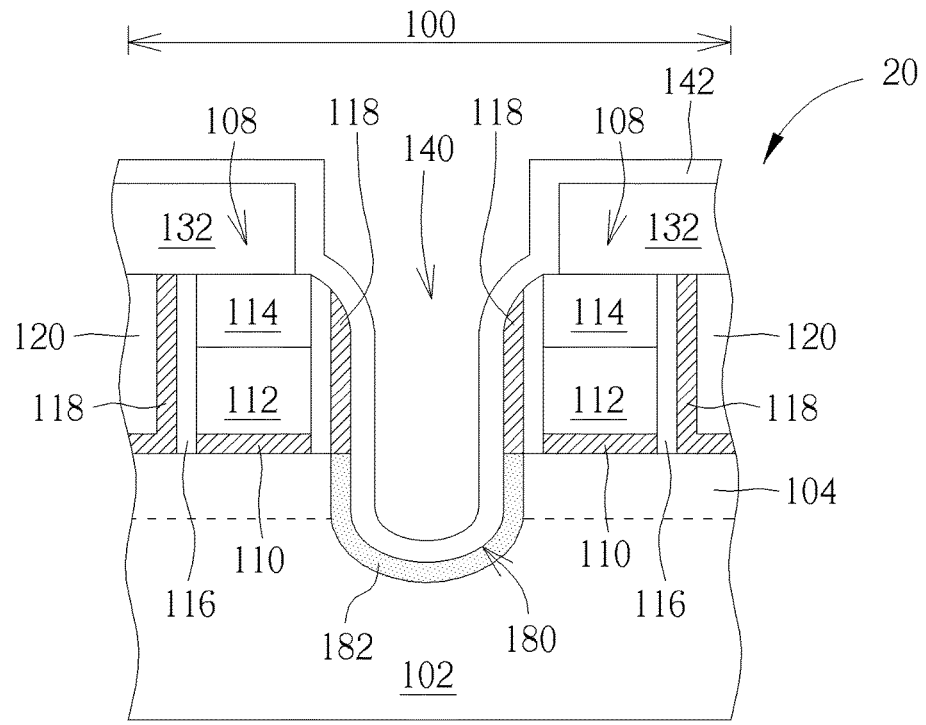
FIG. 9 is a schematic cross-sectional diagram showing a semiconductor device having a doped region at the bottom of a contact hole according to one embodiment of the present invention.

Referring to FIG. 9, a substrate 102 includes a first active region 100 is provided. The first active region 100 may be used to accommodate P-channel field-effect transistors according to the present embodiment. However, the first active region 100 may also be used to accommodate N-channel field-effect transistor in another embodiment. The substrate 102, for example, may be a silicon (Si) monocrystalline substrate, a silicon-on-insulator (SOI) substrate, and/or a silicon-on-sapphire (SOS) substrate.

At least a fin 104 is disposed in the first active region 100 of the substrate 102. The fin 104 may be defined by an isolation structure, such as shallow trench isolation (STI). The fin 104 may be made of materials the same as or different from that of the underlying substrate 102, which is dependent on the fabrication requirements.

A set of gate structures 108 may be formed in the first active regions 100. The gate structures 108 are disposed on the fin 104 in a way that portions of the fin 104 are covered with the gate structures 108. Each of the gate structures 108 may include a gate insulating layer 110, a gate electrode 112, and a capping layer 114 stacked from bottom to top. Spacers 116 made of silicon nitride or silicon carbide may be disposed on the sidewalls of the gate structures 108. The compositions of the gate insulating layer 110, the gate electrode 112, and the capping layer 114 is similar to those disclosed in the first exemplary embodiment shown in FIGS. 1-5, the detailed description of which is omitted for the sake of brevity.

A contact etch stop layer (CESL) 118 may be conformally disposed on the spacers 116. An interlayer dielectric (ILD) 120 is disposed on the substrate 102 to surround the gate structures 108. The top surface of the ILD 120 is preferably aligned with the top surface of the gate structures 108, but not limited thereto. As an example, the ILD 120 may be made of a low-k material, such as impurity-doped CVD glass. A cap layer 132, such as an oxide layer, may be disposed on the gate structures 108 and the ILD 120.

As shown in FIG. 9, a contact hole 140 is formed in the ILD 120 to expose the fin 104 and the substrate 102. In particular, a recess 180 may be formed in the fin 104 and the substrate 102 so that the bottom of the recess 180 is positioned in the substrate 102.

A dopant source layer 142 is conformally deposited on the sidewalls and the bottoms of the contact hole 140. Preferably, the dopant source layer 142 may be further conformally deposited on the surface of the cap layer 132. Since the composition of the dopant source layer 142 in accordance with the third exemplary embodiment is similar to that of the first dopant source layer disclosed in the first exemplary embodiment, the description of which is omitted for the sake of brevity.

A highly doped region 182 is disposed along the upmost surface of the recess 180. For example, the highly doped region 182 may be formed by annealing the dopant source layer 142 to let the dopants in the dopant source layer 142 diffuse out of it and towards the adjacent regions. Preferably, the highly doped region 182 is a U-shaped doped region distributed along the upmost surface of the recess 180. It should be noted that the conductivity type of the highly doped region 182 should correspond to the type of the corresponding field effect transistors. For example, for the highly doped region 182 used in the P-channel field effect transistor, the conductivity of the highly doped region 182 should be P-type.

Figure 10:
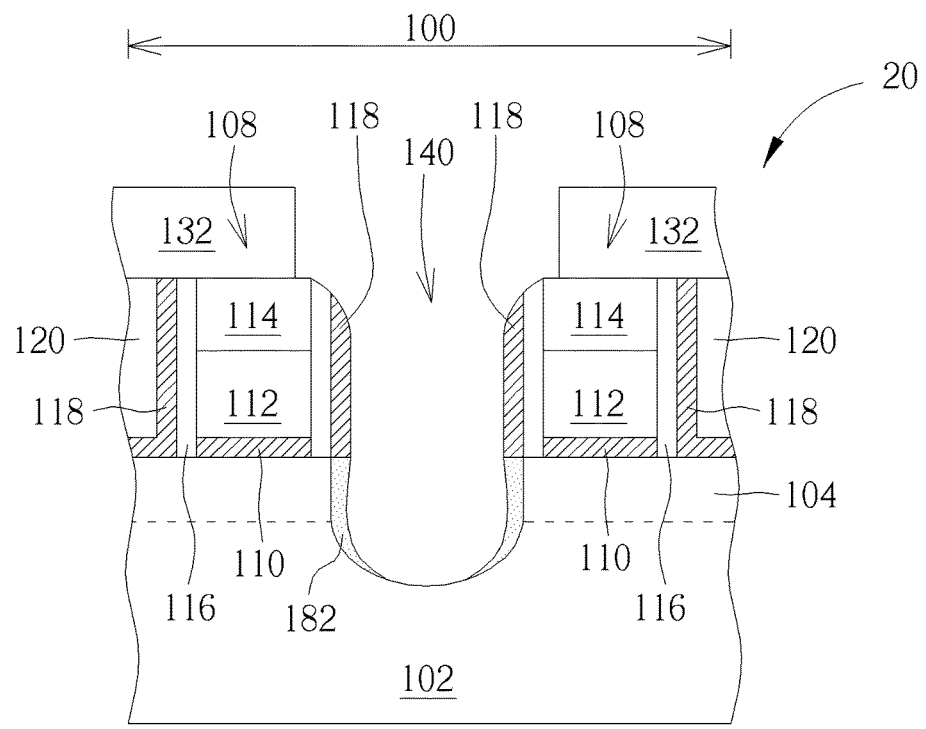
FIG. 10 is a schematic cross-sectional diagram showing a semiconductor device having a patterned doped region at the bottom of a contact hole according to one embodiment of the present invention.
Figure 11:
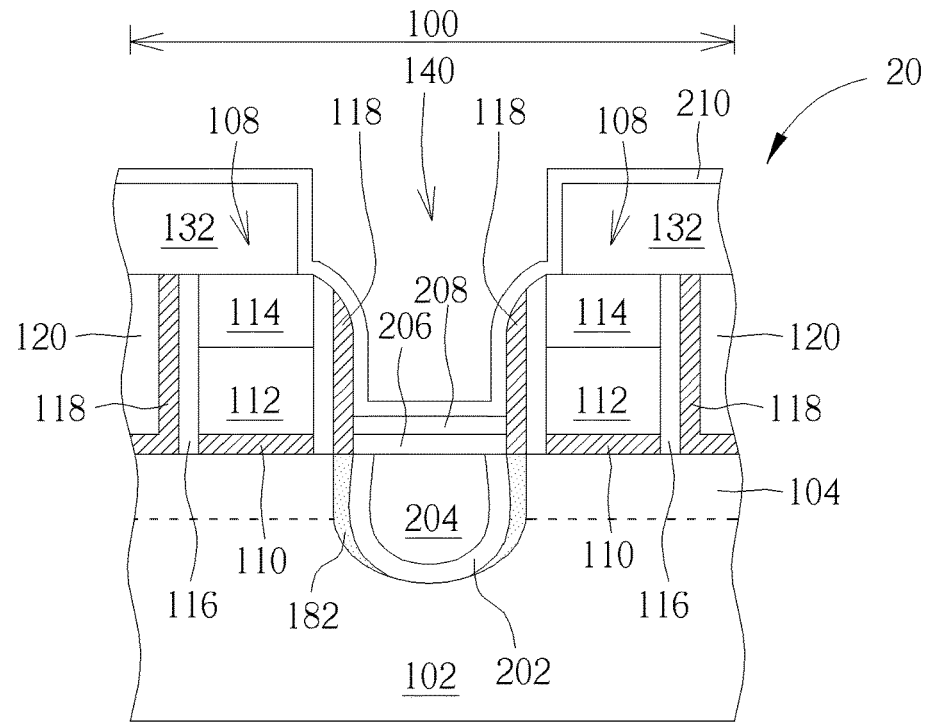
FIG. 11 is a schematic cross-sectional diagram showing a semiconductor device having an epitaxial structure at the bottom of a contact hole according to one embodiment of the present invention.

Then, as shown in FIG. 10, the dopant source region 142 is fully removed after the annealing process. An anisotropic etching process is conducted afterward to remove the portions of the highly doped region 182 at the bottom of the recess 180. Although the highly doped region 182 on both the sidewalls and the bottom of the recess 180 may be etched concurrently during the anisotropic etching process, only the highly doped region 182 at the bottom of the recess 180 may be removed completely and the highly doped region 182 on the sidewalls of the recess 180 may only be etched slightly. The etched highly doped region 182 may function as a source/drain region of a field effect transistor. Since the source/drain region is formed by solid state diffusion process, the doping concentration of which may be very high and uniform compared with conventional source/drain region fabricated by anion implantation process. Besides, the leakage current between the source/drain region and the underlying substrate 102 may also be reduced since there is no highly doped region at the bottom of the recess 180.

Subsequently, as shown in FIG. 10, a buffer layer 202, an epitaxial layer 204, and a epitaxial cap layer 206 may be sequentially grow in the recess 180. For example, the buffer layer 202 may be made of SiGe with lower concentration of germanium atoms. The epitaxial layer 204 may be a multi-layered structure mainly made of SiGe where the concentration of germanium atoms is gradually increased from bottom to top. The epitaxial cap layer 206 may be a silicon cap layer.

Then, a silicide layer 208 may be formed on the epitaxial cap layer 206. The purpose of the silicide layer 208 is to further reduce the contact resistance of the corresponding transistors. After the formation of the silicide layer 208, a barrier metal layer 210 may be conformally deposited on the sidewalls of the contact hole 140 and the silicide layer 208. The barrier metal layer 210 may include nickel (Ni), titanium (Ti), titanium nitride (TiN), tantalum (Ta), tantalum nitride (TaN), titanium aluminum oxide (TiAlO), or other appropriate conductive materials with a single-layered structure or a multi-layered structure.

Figure 12:
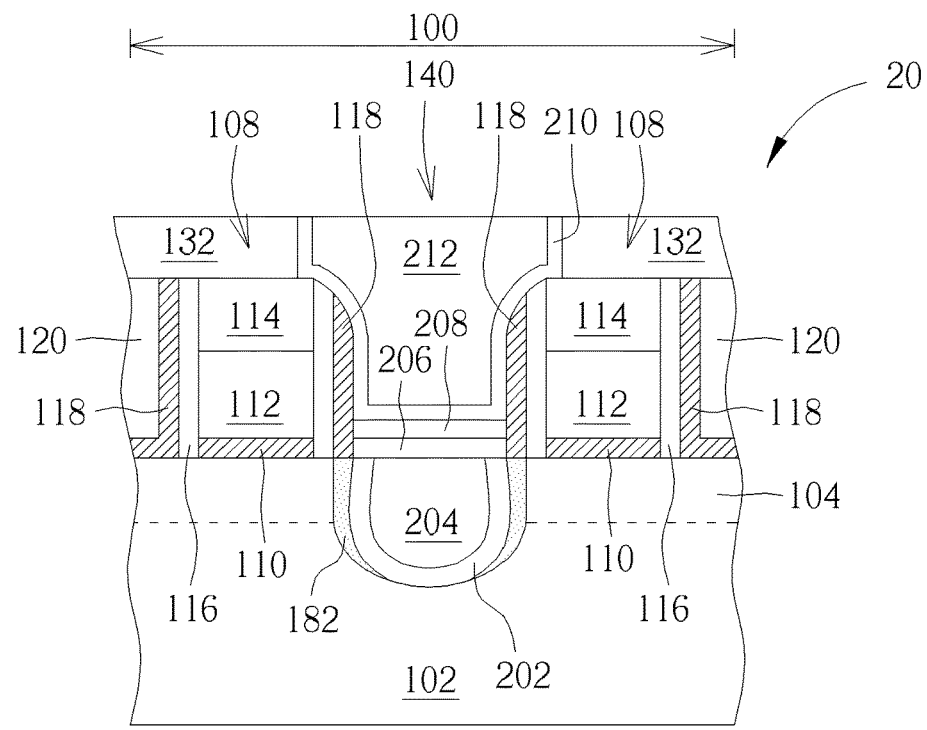
FIG. 12 is a schematic cross-sectional diagram showing a semiconductor device having a contact structure according to one embodiment of the present invention.

Then, as shown in FIG. 12, a main metal layer 212 may be formed after the step of forming the barrier metal layer 210 so that the contact hole 140 may be respectively filled with the main metal layer 212. A planarization process may be used to make upper parts of the cap layer 132, the barrier metal layer 210, and the main metal layer 212 at the same level, but not limited thereto. The main metal layer 212 may include conductive materials with relatively lower electrical resistivity, such as aluminum (Al), tungsten (W), or copper (Cu), but not limited thereto.

Since the highly doped region in accordance with the third embodiment is formed by a solid state diffusion process, the doping concentration of which may be very high and uniform compared with conventional highly doped region fabricated by an ion implantation process. Besides, in a case where the highly doped region function as a source/drain region, the leakage current between the source/drain region and the underlying substrate may be reduced effectively since there is no highly doped region at the bottom of the recess.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a semiconductor substrate having a first fin;
   forming a first set of gate structures on the first fin, wherein the gate structures are surrounded by an interlayer dielectric;
   forming a first contact hole in the interlayer dielectric between two adjacent gate structures;
   forming a first dopant source layer on a bottom of the first contact hole, wherein the dopant source layer comprise a plurality of dopants with a first conductivity type;
   annealing the first dopant source layer to diffuse the dopants out of the first dopant source layer;

removing the first dopant source layer after the step of annealing the first dopant source layer; and forming a contact structure in the first contact hole after the step of removing the first dopant source layer.

2. The method of claim 1, wherein the first dopant source layer is conformally disposed on sidewalls and the bottom of the first contact hole.

3. The method of claim 1, wherein the semiconductor substrate further comprises a second fin, the method further comprising:

forming a second set of gate structures on the second fin, wherein the second set of gate structures are surrounded by the interlayer dielectric;

forming a second contact hole in the interlayer dielectric between two adjacent of the second set of gate structures; and forming a second dopant source layer conformally disposed on a bottom of the second contact hole, wherein the second dopant source layer comprise a plurality of dopants with a second conductivity type.

4. The method of claim 3, wherein the second dopant source layer is conformally disposed on sidewalls and the bottom of the second contact hole.

5. The method of claim 3, wherein the second dopant source layer is conformally disposed on the surface of the first dopant source layer in the first contact hole.

6. The method of claim 3, wherein the first contact hole is formed before the step of forming the second contact hole.

7. The method of claim 1, further comprising:

forming an epitaxial structure on the first fin at a side of one of the gate structures;

exposing the epitaxial structure from the first contact hole; and forming the first dopant source layer conformally disposed on a top surface of the epitaxial structure.

8. The method of claim 7, further comprising diffuse the dopants from the first dopant source layer to the epitaxial structure during the step of annealing the first dopant source layer.

9. The method of claim 1, before the step of annealing the first dopant source layer, the method further comprising:

exposing the first fin from the first contact hole during the step of forming the first contact hole;

etching the first fin exposed from the first contact hole to form a recess; and forming the first dopant source layer conformally disposed on the surface of the recess.

10. The method of claim 9, further comprising forming a doped region in the first fin during the step of annealing the first dopant source layer.

11. The method of claim 10, further comprising removing the doped region at the bottom of the recess.

12. The method of claim 11, further comprising forming an epitaxial structure in the recess after the step of removing the doped region at the bottom of the recess, wherein the epitaxial structure is in direct contact with the doped region.

13. A method for fabricating a semiconductor device, comprising:

providing a semiconductor substrate having at least two fins respectively in a first region and a second region of the semiconductor substrate;

forming a plurality of gate structures respectively on the fins in the first region and a second region, wherein the gate structures are surrounded by an interlayer dielectric;

forming a first contact hole in the interlayer dielectric between two adjacent gate structures in the first region;

forming a second contact hole in the interlayer dielectric between other two adjacent gate structures in the second region;

forming a first dopant source layer on a bottom of the first contact hole, wherein the dopant source layer comprise a plurality of dopants with a first conductivity type;

forming a second dopant source layer conformally disposed on a bottom of the second contact hole after the step of forming a first dopant source layer, wherein the second dopant source layer comprise a plurality of dopants with a second conductivity type;

annealing the first dopant source layer and the second dopant source layer to diffuse the dopants respectively out of the first dopant source layer and the second dopant source layer;

removing the first dopant source layer and the second dopant source layer concurrently after the step of annealing the first and second dopant source layers; and forming two contact structures respectively in the first and second contact holes after the step of removing the first and second dopant source layers.

14. The method of claim 13, wherein the first dopant source layer is conformally disposed on sidewalls and the bottom of the first contact hole, and the second dopant source layer is conformally disposed on sidewalls and the bottom of the second contact hole.

15. The method of claim 13, wherein the first contact hole and the second contact hole are fabricated concurrently.

16. The method of claim 13, further comprising:

forming a first epitaxial structure and a second epitaxial structure respectively on the fins at sides of the gate structures;

exposing the first and second epitaxial structures respectively from the first contact hole and the second contact hole; and forming the first and second dopant source layers respectively conformally disposed on a top surface of the first and second epitaxial structures.

* * * * *